US007000313B2

(12) United States Patent
McCollum et al.

(10) Patent No.: US 7,000,313 B2
(45) Date of Patent: Feb. 21, 2006

(54) PROCESS FOR FABRICATING CIRCUIT ASSEMBLIES USING ELECTRODEPOSITABLE DIELECTRIC COATING COMPOSITIONS

(75) Inventors: Gregory J. McCollum, Gibsonia, PA (US); Thomas C. Moriarity, Allison Park, PA (US); Kevin C. Olson, Wexford, PA (US); Michael G. Sandala, Pittsburgh, PA (US); Alan E. Wang, Gibsonia, PA (US); Steven R. Zawacky, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 519 days.

(21) Appl. No.: 10/184,192

(22) Filed: Jun. 27, 2002

(65) Prior Publication Data

US 2004/0000049 A1  Jan. 1, 2004

Related U.S. Application Data

(63) Continuation-in-part of application No. 09/901,373, filed on Jul. 9, 2001, now Pat. No. 6,671,950, which is a continuation-in-part of application No. 09/851,904, filed on May 9, 2001, now abandoned, which is a continuation-in-part of application No. 09/802,001, filed on Mar. 8, 2001, now abandoned.

(51) Int. Cl.
*H01K 3/10* (2006.01)

(52) U.S. Cl. ............................ 29/852; 29/846; 427/97; 427/99

(58) Field of Classification Search .................. 29/846, 29/852; 427/97, 99
See application file for complete search history.

(56) References Cited

U.S. PATENT DOCUMENTS

| | | | |
|---|---|---|---|
| 3,451,793 A | 6/1969 | Matsushita | 29/194 |
| 3,455,806 A | 7/1969 | Spoor et al. | 204/181 |
| 3,469,982 A | 9/1969 | Celeste | 96/35.1 |
| 3,663,389 A | 5/1972 | Koral et al. | 204/181 |
| 3,738,835 A | 6/1973 | Bakos | 96/36 |
| 3,749,657 A | 7/1973 | Le Bras et al. | 204/181 |
| 3,793,278 A | 2/1974 | De Bona | 260/29.2 EP |
| 3,833,436 A | 9/1974 | Hillis et al. | 156/13 |
| 3,928,157 A | 12/1975 | Suematsu et al. | 204/181 |
| 3,947,338 A | 3/1976 | Jerabek et al. | 204/181 |
| 3,947,339 A | 3/1976 | Jerabek et al. | 204/181 |
| 3,962,165 A | 6/1976 | Bosso et al. | 260/29.2 EP |
| 3,975,345 A | 8/1976 | Fessler | 260/29.2 N |
| 3,984,299 A | 10/1976 | Jerabek | 204/181 |
| 4,001,101 A | 1/1977 | Bosso et al. | 204/181 |
| 4,116,900 A | 9/1978 | Belanger | 260/18 |
| 4,134,866 A | 1/1979 | Tominaga et al. | 260/18 PN |
| 4,134,932 A | 1/1979 | Kempter et al. | 260/181 |
| 4,238,385 A | 12/1980 | Okado et al. | 260/37 EP |
| 4,238,594 A | 12/1980 | Pampouchidis | 528/69 |
| 4,321,290 A | 3/1982 | Thamus | 427/289 |
| 4,332,711 A | 6/1982 | Kooymans et al. | 523/402 |
| 4,343,885 A | 8/1982 | Reardon, Jr. | 430/177 |
| 4,352,842 A | 10/1982 | Kooymans et al. | 427/385.5 |
| 4,378,264 A | 3/1983 | Pilette et al. | 156/238 |
| 4,419,467 A | 12/1983 | Wismer et al. | 523/414 |
| 4,435,559 A | 3/1984 | Valko | 528/74 |
| 4,436,583 A | 3/1984 | Saiiki et al. | 156/659.1 |
| 4,495,229 A | 1/1985 | Wolf et al. | 427/388.2 |
| 4,508,749 A | 4/1985 | Brannon et al. | 427/43.1 |
| 4,592,816 A | 6/1986 | Emmons et al. | 204/180 |
| 4,601,916 A | 7/1986 | Arachtingi | 427/97 |
| 4,714,516 A | 12/1987 | Eichelberger et al. | 156/628 |
| 5,096,556 A | 3/1992 | Corrigan et al. | 204/181.7 |
| 5,134,056 A | 7/1992 | Schmidt et al. | 156/645 |
| 5,153,986 A | 10/1992 | Brauer et al. | 29/846 |
| 5,188,716 A | 2/1993 | Schwerzel et al. | 204/181.7 |
| 5,224,265 A | 7/1993 | Dux et al. | 29/852 |
| 5,227,008 A | 7/1993 | Klun et al. | 156/630 |
| 5,229,550 A | 7/1993 | Bindra et al. | 174/262 |
| 5,232,548 A | 8/1993 | Ehrenberg et al. | 156/630 |
| 5,242,713 A | 9/1993 | Viehbeck et al. | 427/304 |
| 5,242,780 A | 9/1993 | Lin et al. | 430/190 |
| 5,250,164 A | 10/1993 | Valko | 204/181.7 |
| 5,291,066 A | 3/1994 | Neugebauer et al. | 257/750 |

(Continued)

FOREIGN PATENT DOCUMENTS

DE    2707405    1/1978

(Continued)

OTHER PUBLICATIONS

Parylene: A Protective Conformal Coating for Hybrid Circuits, Speedline Technologies (2000).

(Continued)

*Primary Examiner*—Richard Chang
(74) *Attorney, Agent, or Firm*—Deborah M. Altman

(57) ABSTRACT

Provided is a process for forming metallized vias in a substrate including the steps of (I) applying to an electroconductive substrate an electrodepositable coating composition onto all exposed surfaces of the substrate to form a conformal dielectric coating; (II) ablating a surface of the dielectric coating to expose a section of the substrate; (III) applying a layer of metal to all surfaces to form metallized vias in the substrate. Also disclosed are processes for fabricating a circuit assembly which include the application of an electrodoepositable coating composition onto exposed surfaces of the substrate/core to form a conformal dielectric coating thereon. The electrodepositable coating composition includes a resinous phase dispersed in an aqueous phase, where the resinous phase has a covalently bonded halogen content of at least 1 percent by weight. The dielectric coating derived therefrom has a low dielectric constant and low dielectric loss factor.

48 Claims, No Drawings

U.S. PATENT DOCUMENTS

| | | | | |
|---|---|---|---|---|
| 5,298,685 | A | 3/1994 | Bindra et al. | 174/250 |
| 5,316,787 | A | 5/1994 | Frankeny et al. | 427/97 |
| 5,319,158 | A | 6/1994 | Lee et al. | 174/250 |
| 5,362,359 | A | 11/1994 | Horikoshi et al. | 156/645 |
| 5,590,460 | A | 1/1997 | DiStefano et al. | 29/830 |
| 5,600,035 | A | 2/1997 | Kahle, II et al. | 568/932 |
| 5,601,905 | A | 2/1997 | Watanabe et al. | 428/215 |
| 5,879,808 | A | 3/1999 | Wary et al. | 428/411.1 |
| 6,080,526 | A | 6/2000 | Yang | 430/296 |
| 6,107,003 | A | 8/2000 | Kuwako | 430/314 |
| 6,130,148 | A | 10/2000 | Farnworth et al. | 438/613 |
| 6,130,149 | A | 10/2000 | Chien et al. | 438/613 |
| 6,150,284 | A | 11/2000 | Kawahara | 438/780 |
| 6,165,338 | A | 12/2000 | December et al. | 204/506 |
| 6,177,357 | B1 | 1/2001 | Lu | 438/745 |
| 6,266,874 | B1 | 7/2001 | DiStefano et al. | 29/846 |
| 6,303,230 | B1 | 10/2001 | Watanabe et al. | 428/458 |
| 6,333,555 | B1 | 12/2001 | Farnworth et al. | 257/737 |
| 6,713,587 | B1 * | 3/2004 | McCollum et al. | 528/45 |
| 2002/0004982 | A1 | 1/2002 | Haze et al. | |

FOREIGN PATENT DOCUMENTS

| | | |
|---|---|---|
| EP | 0012463 | 6/1982 |
| EP | 0272500 | 6/1988 |
| EP | 0523479 A2 | 7/1992 |
| EP | 0573053 | 12/1993 |
| FR | 2041471 | 1/1971 |
| JP | 59133232 | 7/1984 |
| JP | 02087590 | 3/1990 |
| JP | 5320313 | 12/1993 |
| JP | 06268378 | 9/1994 |
| JP | 11-071501 | 8/1997 |
| JP | 11071501 | 8/1997 |
| JP | 11021359 | 1/1999 |
| JP | 11-145205 | 5/1999 |
| JP | 11145205 | 5/1999 |
| JP | 20013 05750 | 11/2001 |
| JP | 2001305750 | 11/2001 |
| WO | WO 98/20559 | 5/1998 |
| WO | WO 01/77753 | 10/2001 |

OTHER PUBLICATIONS

SCS Parylene Specifications and Properties product literature, Speedline Technologies (2000).

Encyclopedia of Chemical Technology, Fourth Edition, Supplement Volume, p. 863-901 (1998).

IPC-TM-650 Test Methods Manual, No. 2.3.10, Flammability of Laminates Dec. 1994, pp. 1-3.

*Polymers for Microelectronics*, Presented at the 203$^{rd}$ National Meeting of American Chemical Society, Apr., 1992, Chapter 35, pp. 507-508, by Larry F. Thompson et al.

*Handbook of Flexible Circuits*, p. 242, 1991 by Ken Gilleo.

*Handbook of Polymer Coatings for Electronics*, pp. 114-118, 2$^{nd}$ Edition, by James J. Licari et al.

"Printed wiring boards incorporating Cu-invar-Cu layers," 8028 Electronic Components & Applications, Alfred Goberecht, vol. 10 No. 1, pp. 12-16.

"Printed wiring boards incorporating Cu-invar-Cu layers," 8028 Electronic Components & Applications, Alfred Gogerecht, vol. 10 No. 1, pp. 12-16.

* cited by examiner

PROCESS FOR FABRICATING CIRCUIT ASSEMBLIES USING ELECTRODEPOSITABLE DIELECTRIC COATING COMPOSITIONS

CROSS-REFERENCE TO RELATED APPLICATIONS

This application is a Continuation-In-Part of U.S. patent application Ser. No. 09/802,001, filed Mar. 8, 2001; now abandoned U.S. patent application Ser. No. 09/851 904 filed May 9, 2001; now abandoned and U.S. patent application Ser. No. 09/901.373, filed Jul. 9, 2001 now U.S. Pat. No. 6,671,950 each of which is incorporated in its entirety herein by reference. Also this application is related to U.S. patent application Ser. No. 10/184,195 now U.S. Pat. No. 6,713,587; U.S. patent application Ser. No. 10/184,387; and U.S. patent application Ser. No. 10/183.674 now U.S. Pat. No. 6,824959, all filed concurrently herewith.

FIELD OF THE INVENTION

The present invention relates to processes for forming metallized vias and for fabricating multi-layer circuit assemblies comprising a dielectric coating, particularly a dielectric coating applied by electrodeposition.

BACKGROUND OF THE INVENTION

Electrical components, for example, resistors, transistors, and capacitors, are commonly mounted on circuit panel structures such as printed circuit boards. Circuit panels ordinarily include a generally flat sheet of dielectric material with electrical conductors disposed on a major, flat surface of the sheet, or on both major surfaces. The conductors are commonly formed from metallic materials such as copper and serve to interconnect the electrical components mounted to the board. Where the conductors are disposed on both major surfaces of the panel, the panel may have via conductors extending through holes (or "through vias") in the dielectric layer so as to interconnect the conductors on opposite surfaces. Multi-layer circuit panel assemblies have been made heretofore which incorporate multiple stacked circuit panels with additional layers of dielectric materials separating the conductors on mutually facing surfaces of adjacent panels in the stack. These multi-layer assemblies ordinarily incorporate interconnections extending between the conductors on the various circuit panels in the stack as necessary to provide the required electrical interconnections.

In microelectronic circuit packages, circuits and units are prepared in packaging levels of increasing scale. Generally, the smallest scale packaging levels are typically semiconductor chips housing multiple microcircuits and/or other components. Such chips are usually made from ceramics, silicon, and the like. Intermediate package levels (i.e., "chip carriers") comprising multi-layer substrates may have attached thereto a plurality of small-scale chips housing many microelectronic circuits. Likewise, these intermediate package levels themselves can be attached to larger scale circuit cards, motherboards, and the like. The intermediate package levels serve several purposes in the overall circuit assembly including structural support, transitional integration of the smaller scale microcircuits and circuits to larger scale boards, and the dissipation of heat from the circuit assembly. Substrates used in conventional intermediate package levels have included a variety of materials, for example, ceramic, fiberglass reinforced polyepoxides, and polyimides.

The aforementioned substrates, while offering sufficient rigidity to provide structural support to the circuit assembly, typically have thermal coefficients of expansion much different than that of the microelectronic chips being attached thereto. As a result, failure of the circuit assembly after repeated use is a risk due to failure of adhesive joints between the layers of the assembly.

Likewise, dielectric materials used on the substrates must meet several requirements, including conformality, flame resistance, and compatible thermal expansion properties. Conventional dielectric materials include, for example, polyimides, polyepoxides, phenolics, and fluorocarbons. These polymeric dielectrics typically have thermal coefficients of expansion much higher than that of the adjacent layers.

There has been an increasing need for circuit panel structures which provide high density, complex interconnections. Such a need can be addressed by multi-layer circuit panel structures, however, the fabrication of such multi-layer circuit assemblies has presented serious drawbacks.

Generally multi-layer panels are made by providing individual, dual sided circuit panels with appropriate conductors thereon. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes typically are drilled through the stack at locations where electrical connections between different boards are desired. The resulting holes or "through vias" are then coated or filled with electrically conductive materials usually by plating the interiors of the holes to form a plated through via. It is difficult to drill holes with a high ratio of depth to diameter, thus the holes used in such assemblies must be relatively large and consume a great deal of space in the assembly.

U.S. Pat. No. 6,266,874 B1 discloses of method of making a microelectronic component by providing a conductive substrate or "core"; providing a resist at selected locations on the conductive core; and electrophoretically depositing an uncured dielectric material on the conductive core except at locations covered by the resist. The reference suggests that the electrophoretically deposited material can be a cationic acrylic- or cationic epoxy-based composition as those known in the art and commercially available. The electrophoretically deposited material then is cured to form a conformal dielectric layer, and the resist is removed so that the dielectric layer has openings extending to the conductive core at locations which had been covered by the resist. The holes thus formed and extending to the coated substrate or "core" are commonly referred to as "blind vias". In one embodiment, the structural conductive element is a metal sheet containing continuous through holes or "through vias" extending from one major surface to the opposite major surface. When the dielectric material is applied electrophoretically, the dielectric material is deposited at a uniform thickness onto the conductive element surface and the hole walls. It has been found, however, that the electrophoretically deposited dielectric materials suggested by this reference can be flammable, and thus do not meet typical flame retardancy requirements.

U.S. Pat. Nos. 5,224,265 and 5,232,548 disclose methods of fabricating multi-layer thin-film wiring structures for use in circuit assemblies. The dielectric applied to the core substrate preferably is a fully cured and annealed thermoplastic polymer such as polytetrafluoroethylene, polysulfone, or polyimide-siloxane, preferably applied by lamination.

U.S. Pat. No. 5,153,986 discloses a method of fabricating metal core layers for a multi-layer circuit board. Suitable dielectrics include vapor-depositable conformal polymeric coatings. The method uses perforate solid metal cores and the reference describes generally circuitization of the substrate.

U.S. Pat. No. 4,601,916 suggests that while electrodeposition of an insulating coating directly to the metal wall portions of the holes can create a uniform film of resin on the hole walls without producing thinning of the coating at the top and bottom rims of the holes, the subsequent metal deposits would not adhere to the hole walls and, further, that the electrical insulating properties were inadequate. Hence, the reference is directed to an improved method for forming plated through holes in metal core printed circuit boards by electrophoretically depositing coatings thereon which comprise an electrodepositable resinous coating including a solid inorganic filler in finely divided form. Suitable fillers include clays, silica, alumina, silicates, earths and the like. The composition exhibits a volume resistivity greater than $10^4$ megohm-cm between the printed circuit conductor and the metal core. The method comprises electrophoretically depositing the aforementioned composition onto the metal wall portions of the holes; curing the resinous coating, the thickness of which being at least 0.025 millimeters; creating a hydrophilic microetched surface on the coating with an aqueous oxidizing solution to promote adhesion; depositing a metal layer on the surface of the resinous coating on the hole walls and on the insulating surface layers, the metal layer adhering to the coating with a specified peel strength, and forming a printed circuit on the insulated metal substrate by standard printed circuit techniques.

U.S. Pat. No. 4,238,385 discloses coating compositions for electrophoretic application to electroconductive substrates for printed circuits. The compositions comprise a pigment-containing finely divided synthetic resin powder where the resin includes an epoxy resin and the pigment includes 2 to 10 weight parts of a finely-divided silica, admixed with a cationic resin. The composition forms an insulating film on the electroconductive substrate which is suitable for printed circuits providing desirable properties such as dimensional stability and mechanical strength.

Circuitization of intermediate package levels is conventionally performed by applying a positive- or negative-acting photoresist (hereinafter collectively referred to as "resist") to the metallized substrate, followed by exposure, development, etching and stripping to yield a desired circuit pattern. Resist compositions typically are applied by laminating, spray, or immersion techniques. The resist layer thus applied can have a thickness of 5 to 50 microns.

In addition to the substrates previously mentioned, conventional substrates for intermediate package levels can further include solid metal sheets such as those disclosed in U.S. Pat. No. 5,153,986. These solid structures must be perforated during fabrication of the circuit assembly to provide through vias for alignment purposes.

In view of the prior art processes, there remains a need in the art for multilayer circuit panel structures which provide high density and complex interconnections, the fabrication of which overcomes the drawbacks of the prior art circuit assemblies.

SUMMARY OF THE INVENTION

In one embodiment, the present invention is directed to a process for forming metallized vias in a substrate. The process comprises the steps of: (I) electrophoretically applying to an electroconductive substrate an electrodepositable coating composition onto all exposed surfaces of the substrate to form a conformal dielectric coating thereon, the electrodepositable coating composition comprising a resinous phase dispersed in an aqueous phase, the resinous phase comprising: (a) an ungelled, active hydrogen-containing, ionic group containing resin, and (b) a curing agent reactive with the active hydrogens of the resin (a), the resinous phase having a covalently bonded halogen content of at least 1 percent by weight based on total weight of resin solids present in the resinous phase; (II) ablating a surface of the conformal dielectric coating in a predetermined pattern to expose a section of the substrate; and (III) applying a layer of metal to all surfaces to form metallized vias in the substrate.

In another embodiment, the present invention relates to a process for fabricating a circuit assembly comprising the steps of: (I) providing an electroconductive core; (II) applying electrophoretically the electrodoepositable coating composition described above onto all exposed surfaces of the core to form a conformal dielectric coating thereon; (III) ablating a surface of the conformal dielectric coating in a predetermined pattern to expose a section of the core; (IV) applying a layer of metal to all surfaces to form metallized vias in the core; and (V) applying a resinous photosensitive layer to the metal layer.

The present invention also is directed to a process for fabricating a circuit assembly comprising the steps of: (I) providing an electroconductive core; (II) providing a photoresist at predetermined locations on the surface of the core; (III) applying electrophoretically an electrodepositable coating composition described above over the core of step (II), wherein the coating composition is deposited electrophoretically over all surfaces of the core except at the locations having the photoresist thereon; (IV) curing the electrophoretically applied coating composition to form a cured conformal dielectric layer over all surfaces of the core except at the locations having the photoresist thereon; (V) removing the photoresist to form a circuit assembly having vias extending to the core at the locations previously covered with the resist; and (VI) optionally, applying a layer of metal to all surfaces of the circuit assembly of step (V) to form metallized vias extending to the core.

The present invention is further directed to a substrate and circuit assemblies coated by the respective aforementioned processes.

DETAILED DESCRIPTION OF THE INVENTION

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

As previously mentioned, in one embodiment, the present invention is directed to a process for forming metallized vias in a substrate, the process comprising: (I) electrophoretically applying to an electroconductive substrate an electrodepositable coating composition (described in detail below) onto all surfaces of the substrate to form a conformal dielectric coating thereon; (II) ablating a surface of the dielectric coating in a predetermined pattern to expose a section of the substrate; and (III) applying a layer of metal to all surfaces of the substrate of step (II) to form metallized vias in the substrate. Optionally, the process further includes step (IV) applying a photosensitive layer, as described below, to the metal layer.

In further embodiments, the present invention is directed to processes for fabricating multi-layer circuit assemblies. In one embodiment, the present invention is directed to a process for fabricating a circuit assembly comprising the steps of: (I) providing an electroconductive core, typically a metal core as discussed below; (II) applying electrophoretically any of the previously discussed electrodepositable coating compositions onto all exposed surfaces of the core to form a conformal dielectric coating thereon; (III) ablating a surface of the conformal dielectric coating in a predetermined pattern to expose a section of the core; (IV) applying a layer of metal for example, copper, to all surfaces to form metallized vias in the core; and (V) applying a resinous photosensitive layer to the metal layer.

The substrate or core can comprise any of a variety of electroconductive substrates, particularly metal substrates, for example, untreated or galvanized steel, aluminum, gold, nickel, copper, magnesium or alloys of any of the foregoing metals, as well as conductive carbon coated materials. Also, the core has two major surfaces and edges and can have a thickness ranging from 10 to 100 microns, typically from 25 to 100 microns.

It should be understood that for purposes of the processes of the present invention the formation of metallized vias "in the core" is intended to encompass the formation of "through vias" (i.e., the formation of metallized holes extending through the core from one major surface to the other) to provide through connections, as well as the formation of "blind vias" (i.e., the formation of metallized holes extending through the dielectric coating only to, but not through, the core) to provide connections, for example, to ground or power. Also, for purposes of the present invention, the formation of metallized vias extending "through the core" is intended to encompass the formation of through vias only. Likewise, the formation of metallized vias extending "to the core" is intended to encompass the formation of blind vias only.

In a particular embodiment of the present invention, the core is a metal substrate selected from perforate copper foil, an iron-nickel alloy or combinations thereof. In one embodiment of the present invention, the core comprises an iron-nickel alloy commercially available as INVAR (trademark of Imphy S. A., 168 Rue de Rivoli, Paris, France) comprising approximately 64 weight percent iron and 36 weight percent nickel. This alloy has a low coefficient of thermal expansion comparable to that of the silicon materials typically used to prepare chips. This property is desirable in order to prevent failure of adhesive joints between successively larger or smaller scale layers of a chip scale package due to thermal cycling during normal use. When an iron-nickel alloy is used as the metal core, a layer of metal, usually copper, typically is applied to all surfaces of the iron-nickel alloy core to ensure optimal conductivity. This layer of metal as well as that applied in step (IV) can be applied by conventional means and for example, by electroplating and metal vapor deposition techniques, electroless plating, and typically has a thickness of from 1 to 10 microns.

By "perforate metal core" is meant a mesh sheet having a plurality of holes or vias spaced at regular intervals. The diameter of the holes usually is about 200 microns, but may be larger or smaller as necessary, provided that the diameter is large enough to accommodate all the layers applied in the process of the present invention without the holes becoming obstructed. The center-to-center spacing of the holes typically is about 500 microns, but, likewise, may be larger or smaller as necessary. Via density can range from 500 to 10,000 holes per square inch (77.5 to 1,550 holes per square centimeter).

Any of the electrodepositable coating compositions described in detail below can be electrophoretically applied to the electroconductive core. The applied voltage for electrodeposition may be varied and can be, for example, as low as 1 volt to as high as several thousand volts, but typically between 50 and 500 volts. The current density is usually between 0.5 ampere and 5 amperes per square foot (0.5 to 5 milliamperes per square centimeter) and tends to decrease during electrodeposition indicating the formation of an insulating conformal film on all exposed surfaces of the core. As used herein, in the specification and in the claims, by "conformal" film or coating is meant a film or coating having a substantially uniform thickness which conforms to the substrate topography, including the surfaces within (but, preferably, not occluding) the holes. After the coating has been applied by electrodeposition, it typically is thermally cured at elevated temperatures ranging from 90° to 300° C. for a period of 1 to 40 minutes to form a conformal dielectric coating over all exposed surfaces of the core.

It should be understood, that for purposes of the processes of the present invention, any of the electrodepositable coating compositions (described in detail below) can be applied by a variety of application techniques other than electrodeposition which are well-know in the art, for example, by roll-coating or spray application techniques. In such instances, it may be desirable to prepare the composition at higher resin solids content. Also, for such applications, the resinous binder may or may not include solubilizing or neutralizing acids and amines to form cationic and anionic salt groups, respectively.

The dielectric coating is of uniform thickness and often can be no more than 50 microns, usually no more than 25 microns, and typically no more than 20 microns. A lower film thickness is desirable for a variety of reasons. For example, a dielectric coating having a low film thickness allows for smaller scale circuitry. Also, a coating have a low dielectric constant (as discussed above) allows for a dielectric coating having lower film thickness and also minimizes capacitive coupling between adjacent signal traces.

Those skilled in the art would recognize that prior to the electrophoretic application of the dielectric coating, the core surface may be pretreated or otherwise prepared for the application of the dielectric. For example, cleaning, rinsing, and/or treatment with an adhesion promoter prior to application of the dielectric may be appropriate.

After application of the dielectric coating, the surface of the dielectric coating is ablated in a predetermined pattern to expose one or more sections of the core. Such ablation typically is performed using a laser or by other conventional techniques, for example, mechanical drilling and chemical or plasma etching techniques.

Metallization is performed after the ablation step by applying a layer of metal to all surfaces, allowing for the formation of metallized vias in the core. Suitable metals include copper or any metal or alloy with sufficient conductive properties. The metal is typically applied by electroplating or any other suitable method known in the art to provide a uniform metal layer. The thickness of this metal layer can range from 1 to 50 microns, typically from 5 to 25 microns.

To enhance the adhesion of the metal layer to the dielectric polymer, prior to the metallization step all surfaces can be treated with ion beam, electron beam, corona discharge or plasma bombardment followed by application of an adhesion promoter layer to all surfaces. The adhesion promoter layer can range from 50 to 5000 Ångstroms thick and typically is a metal or metal oxide selected from chromium, titanium, nickel, cobalt, cesium, iron, aluminum, copper, gold, tungsten and zinc, and alloys and oxides thereof.

After metallization, a resinous photosensitive layer (i.e. "photoresist" or "resist") can be applied to the metal layer. Optionally, prior to application of the photoresist, the metallized substrate can be cleaned and/or pretreated; e.g., treated with an acid etchant to remove oxidized metal. The resinous photosensitive layer can be a positive or negative photoresist. The photoresist layer can have a thickness ranging from 1 to 50 microns, typically from 5 to 25 microns, and can be applied by any method known to those skilled in the photolithographic processing art. Additive or subtractive processing methods may be used to create the desired circuit patterns.

Suitable positive-acting photosensitive resins include any of those known to practitioners skilled in the art. Examples include dinitrobenzyl functional polymers such as those disclosed in U.S. Pat. No. 5,600,035, columns 3–15. Such resins have a high degree of photosensitivity. In one embodiment, the resinous photosensitive layer is a composition comprising a dinitrobenzyl functional polymer, typically applied by spraying.

In a separate embodiment, the resinous photosensitive layer comprises an electrodepositable composition comprising a dinitrobenzyl functional polyurethane and an epoxyamine polymer such as that described in Examples 3–6 of U.S. Pat. No. 5,600,035.

Negative-acting photoresists include liquid or dry-film type compositions. Any of the previously described liquid compositions may be applied by spray; roll-coating; spin-coating, curtain-coating, screen-coating, immersion coating, or electrodeposition application techniques.

In one embodiment, the liquid photoresists are applied by electrodeposition, usually by cationic electrodeposition. Electrodepositable photoresist compositions comprise an ionic, polymeric material which may be cationic or anionic, and may be selected from polyesters, polyurethanes, acrylics, and polyepoxides. Examples of photoresists applied by anionic electrodeposition are shown in U.S. Pat. No. 3,738,835. Photoresists applied by cationic electrodeposition are described in U.S. Pat. No. 4,592,816. Examples of dry-film photoresists include those disclosed in U.S. Pat. Nos. 3,469,982, 4,378,264, and 4,343,885. Dry-film photoresists are typically laminated onto the surface such as by application of hot rollers.

Note that after application of the photosensitive layer, the multi-layer substrate may be packaged at this point allowing for transport and processing of any subsequent steps at a remote location.

In an embodiment of the invention, after the photosensitive layer is applied, a photo-mask having a desired pattern may be placed over the photosensitive layer and the layered substrate exposed to a sufficient level of a suitable radiation source, typically an actinic radiation source. As used herein, the term "sufficient level of radiation" refers to that level of radiation which polymerizes the monomers in the radiation-exposed areas in the case of negative acting resists, or which de-polymerizes the polymer or renders the polymer more soluble in the case of positive acting resists. This results in a solubility differential between the radiation-exposed and radiation-shielded areas.

The photo-mask may be removed after exposure to the radiation source and the layered substrate developed using conventional developing solutions to remove more soluble portions of the photosensitive layer, and uncover selected areas of the underlying metal layer. The metal uncovered may then be etched using metal etchants which convert the metal to water soluble metal complexes. The soluble complexes may be removed by water spraying.

The photosensitive layer protects the underlying substrate during the etching step. The remaining photosensitive layer, which is impervious to the etchants, may then be removed by a chemical stripping process to provide a circuit pattern connected by the metallized vias.

After preparation of the circuit pattern on the multi-layered substrate, other circuit components may be attached to form a circuit assembly. Additional components include, for example, one or more smaller scale components such as semiconductor chips, interposer layers, larger scale circuit cards or mother boards and active or passive components. Note that interposers used in the preparation of the circuit assembly may be prepared using appropriate steps of the process of the present invention. Components may be attached using conventional adhesives, surface mount techniques, wire bonding or flip chip techniques. High via density in the multi-layer circuit assembly prepared in accordance with the present invention allows for more electrical interconnects from highly functional chips to the packages in the assembly.

In another embodiment, the present invention is directed to a process for fabricating a circuit assembly comprising the steps of (I) providing a core, such as any of the previously described metal cores; (II) providing a photoresist, such as any of the photoresist compositions described above, at predetermined locations on the surface of the core; (III) applying electrophoretically any of the electrodepositable coating compositions described in detail below over the core of step (II), wherein the coating composition is deposited electrophoretically over all surfaces of the core except at the locations having the photoresist thereon; (IV) curing the electrophoretically applied coating composition under the curing conditions described above to form a cured conformal dielectric layer over all surfaces of the core except at the locations having the photoresist thereon; (V) removing the photoresist, as described above, to form a circuit assembly having vias extending to the metal core at the locations previously covered with the resist; and (VI) optionally, applying a layer of metal, usually copper metal, to all surfaces of the circuit assembly of step (V) by any of the previously described methods for metallizing to form metallized vias extending to the core. In a particular embodiment of the present invention, prior to providing the resist in step (II) at predetermined locations on the surface of the metal core, a layer of metal, typically copper metal, is applied to the metal core.

The electrodepositable coating compositions suitable for use in any of the previously discussed processes comprise a resinous phase dispersed in an aqueous medium. The resinous phase comprises: (a) an ungelled, active hydrogen-containing, ionic salt group-containing resin; and (b) a curing agent reactive with the active hydrogens of the resin (a).

In one embodiment of the present invention, the resinous phase has a covalently bonded halogen content based on total weight of resin solids present in said resinous phase such that when the composition is electrodeposited and cured to form a cured film, the cured film passes flame resistance testing in accordance with IPC-TM-650, and has a dielectric constant of less than or equal to 3.50. It should be understood that for purposes of the present invention, by "covalently bonded halogen" is meant a halogen atom that is covalently bonded as opposed to a halogen ion, for example, a chloride ion in aqueous solution.

The resinous phase of the electrodepositable coating composition of the present invention can have a covalently bonded halogen content of at least 1 weight percent, usually at least 2 weight percent, often at least 5 weight percent, and typically at least 10 weight percent. Also, the resinous phase of the electrodepositable coating composition of the present invention can have a covalently bonded halogen content of less than 50 weight percent, usually less than 30 weight percent, often less than 25 weight percent, and typically less than 20 weight percent. The resinous phase of the electrodepositable coating composition can have a covalently bonded halogen content which can range between any combination of these values, inclusive of the recited values, provided that the covalently bonded halogen content is sufficient to provide a cured coating which passes flame resistance testing in accordance with IPC-TM-650 as described below.

Additionally, it should be noted that the covalently bonded halogen content of the resinous phase can be derived from halogen atoms covalently bonded to one or both of the resin (a) and the curing agent (b), or halogen atoms covalently bonded to a compound (c) which is different from and present as a component in the resinous phase of the electrodepositable coating composition in addition to the resin (a) and the curing agent (b).

As discussed above, for purposes of the present invention, flame resistance is tested in accordance with IPC-TM-650, Test Methods Manual, Number 2.3.10, "Flammability of Laminate", Revision B, available from the Institute of Interconnecting and Packaging Electronic Circuits, 2215 Sanders Road, Northbrook, Ill.

When the electrodepositable coating composition described above is electrophoretically deposited and cured to form a cured film (as described in detail below), the cured film can have a dielectric constant of no more than 3.50, often no more than 3.30, usually of no more than 3.00, and typically no more than 2.80. Also, the cured film typically has a dielectric loss factor of less than or equal to 0.02, usually less than or equal to 0.15, and can be less than or equal to 0.01.

A dielectric material is a non-conducting substance or insulator. The "dielectric constant" is an index or measure of the ability of a dielectric material to store an electric charge. The dielectric constant is directly proportional to the capacitance of a material, which means that the capacitance is reduced if the dielectric constant of a material is reduced. A low dielectric material is desired for high frequency, high speed digital where the capacitances of substrates and coatings are critical to the reliable functioning of circuits. For example, present computer operations are limited by coupling capacitance between circuit paths and integrated circuits on multi-layer assemblies since computing speed between integrated circuits is reduced by this capacitance and the power required to operate is increased. See Thompson, Larry F., et al., *Polymers for Microelectronics*, presented at the 203$^{rd}$ National Meeting of American Chemical Society, Apr. 5–10, 1992.

The "dielectric loss factor" is the power dissipated by a dielectric material as the friction of its molecules opposes the molecular motion produced by an alternating electric field. See I. Gilleo, Ken, *Handbook of Flexible Circuits*, at p. 242, Van Nostrand Reinhold, New York (1991). See also, James J. Licari and Laura A. Hughes, *Handbook of Polymer Coatings for Electronics*, pp. 114–18, 2$^{nd}$ ed., Noyes Publication (1990) for a detailed discussion of dielectric materials and dielectric constant.

For purposes of the present invention, the dielectric constant of the cured electrodepositable coating composition is determined at a frequency of 1 megahertz using electrochemical impedance spectroscopy as follows.

The coating sample is prepared by application of the electrodepositable composition to a steel substrate and subsequent curing to provide a cured dielectric coating having a film thickness of 0.85 mil (20.83 microns). A 32 square centimeter free film of the cured dielectric coating is placed in the electrochemical cell with 150 milliliters of electrolyte solution (1 M NaCl) and allowed to equilibrate for one hour. An AC potential of 100 mV is applied to the sample and the impedance is measured from 1.5 megahertz to 1 hertz frequency range. The method employs a platinum-on-niobium expanded mesh counter electrode and a single junction silver/silver chloride reference electrode. The dielectric constant of the cured coating is determined by calculating the capacitance at 1 megahertz, 1 kilohertz, and 63 hertz, and solving the following equation for E.

$$C = E_o E A / d$$

where C is the measured capacitance at discrete frequency (in Farads); $E_o$ is the permitivity of free space (8.854187817$^{12}$); A is the sample area (32 square centimeters; d is the coating thickness; and E is the dielectric constant. It should be noted the values for dielectric constant as used in the specification and in the claims is the dielectric constant determined as described above at a frequency of 1 megahertz. Likewise, values for the dielectric loss factor as used in the specification and in the claims is the difference between the dielectric constant measured at a frequency of 1 megahertz as described above, and the dielectric constant for the same material measured at a frequency of 1.1 megahertz.

The electrodepositable coating compositions useful in the processes of the present invention comprise as a main film-former, an ungelled, active hydrogen ionic group-containing electrodepositable resin (a). A wide variety of electrodepositable film-forming polymers are known and can be used in the electrodepositable coating compositions of the present invention so long as the polymers are "water dispersible," i.e., adapted to be solubilized, dispersed or emulsified in water. The water dispersible polymer is ionic in nature, that is, the polymer can contain anionic functional groups to impart a negative charge or cationic functional groups to impart a positive charge. In a particular embodiment of the present invention, the resin (a) comprises cationic salt groups, usually cationic amine salt groups.

By "ungelled" is meant the resins are substantially free of crosslinking and have an intrinsic viscosity when dissolved in a suitable solvent, as determined, for example, in accordance with ASTM-D1795 or ASTM-D4243. The intrinsic viscosity of the reaction product is an indication of its molecular weight. A gelled reaction product, on the other hand, since it is of essentially infinitely high molecular weight, will have an intrinsic viscosity too high to measure. As used herein, a reaction product that is "substantially free of crosslinking" refers to a reaction product that has a weight average molecular weight (Mw), as determined by gel permeation chromatography, of less than 1,000,000.

Also, as used herein, the term "polymer" is meant to refer to oligomers and both homopolymers and copolymers. Unless stated otherwise, molecular weights are number average molecular weights for polymeric materials indicated as "Mn" and obtained by gel permeation chromatography using a polystyrene standard in an art-recognized manner.

Non-limiting examples of film-forming resins suitable for use as the resin (a) in anionic electrodepositable coating compositions include base-solubilized, carboxylic acid group-containing polymers such as the reaction product or adduct of a drying oil or semi-drying fatty acid ester with a dicarboxylic acid or anhydride; and the reaction product of a fatty acid ester, unsaturated acid or anhydride and any additional unsaturated modifying materials which are further reacted with polyol. Also suitable are the at least partially neutralized interpolymers of hydroxy-alkyl esters of unsaturated carboxylic acids, unsaturated carboxylic acid and at least one other ethylenically unsaturated monomer. Still another suitable electrodepositable resin comprises an alkyd-aminoplast vehicle, i.e., a vehicle containing an alkyd resin and an amine-aldehyde resin. Another suitable anionic electrodepositable resin composition comprises mixed esters of a resinous polyol. These compositions are described in detail in U.S. Pat. No. 3,749,657 at col. 9, lines 1 to 75 and col. 10, lines 1 to 13, all of which are herein incorporated by reference. Other acid functional polymers can also be used such as phosphatized polyepoxide or phosphatized acrylic polymers as are well known to those skilled in the art. Additionally, suitable for use as the resin (a) are those resins comprising one or more pendent carbamate functional groups, for example, those described in U.S. Pat. No. 6,165,338.

In one particular embodiment of the present invention, the active hydrogen-containing ionic electrodepositable resin (a) is cationic and capable of deposition on a cathode. Non-limiting examples of such cationic film-forming resins include amine salt group-containing resins such as the acid-solubilized reaction products of polyepoxides and primary or secondary amines such as those described in U.S. Pat. Nos. 3,663,389; 3,984,299; 3,947,338; and 3,947,339. Usually, these amine salt group-containing resins are used in combination with a blocked isocyanate curing agent as described in detail below. The isocyanate can be fully blocked as described in the aforementioned U.S. Pat. No. 3,984,299 or the isocyanate can be partially blocked and reacted with the resin backbone such as described in U.S. Pat. No. 3,947,338. Also, one-component compositions as described in U.S. Pat. No. 4,134,866 and DE-OS No. 2,707,405 can be used in the electrodepositable coating compositions of the present invention as the resin (a). Besides the epoxy-amine reaction products discussed immediately above, the resin (a) can also be selected from cationic acrylic resins such as those described in U.S. Pat. Nos. 3,455,806 and 3,928,157.

Besides amine salt group-containing resins, quaternary ammonium salt group-containing resins can also be employed. Examples of these resins include those which are formed from reacting an organic polyepoxide with a tertiary amine salt. Such resins are described in U.S. Pat. Nos. 3,962,165; 3,975,346; and 4,001,101. Examples of other cationic resins are ternary sulfonium salt group-containing resins and quaternary phosphonium salt-group containing resins such as those described in U.S. Pat. Nos. 3,793,278 and 3,984,922, respectively. Also, film-forming resins which cure via transesterification such as described in European Application No. 12463 can be used. Further, cationic compositions prepared from Mannich bases such as described in U.S. Pat. No. 4,134,932 can be used.

In one embodiment of the present invention, the resin (a) can comprise one or more positively charged resins which contain primary and/or secondary amine groups. Such resins are described in U.S. Pat. Nos. 3,663,389; 3,947,339; and 4,116,900. In U.S. Pat. No. 3,947,339, a polyketimine derivative of a polyamine such as diethylenetriamine or triethylenetetraamine is reacted with a polyepoxide. When the reaction product is neutralized with acid and dispersed in water, free primary amine groups are generated. Also, equivalent products are formed when polyepoxide is reacted with excess polyamines such as diethylenetriamine and triethylenetetraamine and the excess polyamine vacuum stripped from the reaction mixture. Such products are described in U.S. Pat. Nos. 3,663,389 and 4,116,900.

Mixtures of the above-described ionic resins also can be used advantageously. In one embodiment of the present invention, the resin (a) comprises a polymer having cationic salt groups and is selected from a polyepoxide-based polymer having primary, secondary and/or tertiary amine groups (such as those described above) and an acrylic polymer having hydroxyl and/or amine functional groups.

As previously discussed, in one particular embodiment of the present invention, the resin (a) comprises cationic salt groups. In this instance, such cationic salt groups typically are formed by solubilizing the resin with an inorganic or organic acid such as those conventionally used in electrodepositable compositions. Suitable examples of solubilizing acids include, but are not limited to, sulfamic, acetic, lactic, and formic acids. Sulfamic and lactic acids are most commonly employed.

Also, as aforementioned, the covalently bonded halogen content of the resinous phase of the electrodepositable coating composition can be derived from halogen atoms covalently bonded to the resin (a). In such instances, the covalently bonded halogen content can be attributed to a reactant used to form any of the film-forming ionic resins described above. For example, in the case of an anionic group-containing polymer, the resin may be the reaction product of a halogenated phenol, for example a halogenated polyhydric phenol such as chlorinated or brominated bisphenol A with an epoxy compound followed by reaction with phosphoric acid, or alternatively, an epoxy compound reacted with a halogenated carboxylic acid, followed by reaction of any residual epoxy groups with phosphoric acid. The acid groups can then be solubilized with an amine. Likewise, in the case of a cationic salt group-containing polymer, the resin may be the reaction product of diglycidyl ether of Bisphenol A with a halogenated phenol, follow by reaction of any residual epoxy groups with an amine. The reaction product then can be solubilized with an acid.

In one embodiment of the present invention, the covalently bonded halogen content of the resin (a) can be derived from a halogenated phenol, trichlorobutylene oxide, and mixtures thereof. In another embodiment of the present invention, the covalently bonded halogen content of the resin (a) is derived from a halogenated polyhydric phenol, for example, chlorinated bisphenol A such as tetrachlorobisphenol A, or a brominated bisphenol A such as tetrabromobisphenol A. In a further embodiment of the present invention, the covalently bonded halogen content of the resin (a) can be derived from a halogenated epoxy compound, for example the diglycidyl ether of a halogenated bisphenol A.

The active hydrogen-containing ionic electrodepositable resin (a) described above can be present in the electrodepositable coating composition of the present invention in amounts ranging from 5 to 90 percent by weight, usually 10 to 80 percent by weight, often 10 to 70 percent by weight, and typically 10 to 30 percent by weight based on total weight of the electrodepositable coating composition.

As mentioned above, the resinous phase of the electrodepositable coating composition of the present invention further comprises (b) a curing agent adapted to react with the active hydrogens of the ionic electrodepositable resin (a) described immediately above. Both blocked organic polyisocyanate and aminoplast curing agents are suitable for use in the present invention, although blocked isocyanates typically are employed for cathodic electrodeposition.

Aminoplast resins, which are common curing agents for anionic electrodeposition, are the condensation products of amines or amides with aldehydes. Examples of suitable amine or amides are melamine, benzoguanamine, urea and similar compounds. Generally, the aldehyde employed is formaldehyde, although products can be made from other aldehydes such as acetaldehyde and furfural. The condensation products contain methylol groups or similar alkylol groups depending on the particular aldehyde employed. Preferably, these methylol groups are etherified by reaction with an alcohol. Various alcohols employed include monohydric alcohols containing from 1 to 4 carbon atoms such as methanol, ethanol, isopropanol, and n-butanol, with methanol being preferred. Aminoplast resins are commercially available from American Cyanamid Co. under the trademark CYMEL and from Monsanto Chemical Co. under the trademark RESIMENE.

The aminoplast curing agents typically are utilized in conjunction with the active hydrogen containing anionic electrodepositable resin in amounts ranging from 1 to 90, often from 5 percent to about 60 percent by weight, preferably from 20 percent to 40 percent by weight, the percentages based on the total weight of the resin solids in the electrodepositable coating composition.

The curing agents commonly employed in cathodic electrodeposition compositions are blocked polyisocyanates. The polyisocyanates can be fully blocked as described in U.S. Pat. No. 3,984,299 column 1 lines 1 to 68, column 2 and column 3 lines 1 to 15, or partially blocked and reacted with the polymer backbone as described in U.S. Pat. No. 3,947,338 column 2 lines 65 to 68, column 3 and column 4 lines 1 to 30, which are incorporated by reference herein. By "blocked" is meant that the isocyanate groups have been reacted with a compound such that the resultant blocked isocyanate group is stable to active hydrogens at ambient temperature but reactive with active hydrogens in the film forming polymer at elevated temperatures usually between 90° C. and 200° C.

Suitable polyisocyanates include aromatic and aliphatic polyisocyanates, including cycloaliphatic polyisocyanates and representative examples include diphenylmethane-4,4'-diisocyanate (MDI), 2,4- or 2,6-toluene diisocyanate (TDI), including mixtures thereof, p-phenylene diisocyanate, tetramethylene and hexamethylene diisocyanates, dicyclohexylmethane-4,4'-diisocyanate, isophorone diisocyanate, mixtures of phenylmethane-4,4'-diisocyanate and polymethylene polyphenylisocyanate. Higher polyisocyanates such as triisocyanates can be used. An example would include triphenylmethane-4,4',4"-triisocyanate. Isocyanate prepolymers with polyols such as neopentyl glycol and trimethylolpropane and with polymeric polyols such as polycaprolactone diols and triols (NCO/OH equivalent ratio greater than 1) can also be used.

The polyisocyanate curing agents typically are utilized in conjunction with the active hydrogen containing cationic electrodepositable resin (a) in amounts ranging from ranging from 1 to 90 percent by weight, usually 1 to 80 percent by weight, often 1 to 70 percent by weight, and typically 1 to 15 percent by weight based on total weight of the electrodepositable coating composition.

Also suitable are beta-hydroxy urethane curing agents such as those described in U.S. Pat. Nos. 4,435,559 and 5,250,164. Such beta-hydroxy urethanes are formed from an isocyanate compound, for example, any of those described immediately above, a 1,2-polyol and/or a conventional blocking such as monoalcohol. Also suitable are the secondary amine blocked aliphatic and cycloaliphatic isocyanates described in U.S. Pat. Nos. 4,495,229 and 5,188,716.

As previously discussed, in one embodiment of the present invention, the curing agent (b) can have a covalently bonded halogen content of up to 60 weight percent, often from 1 to 50 weight percent, often from 2 to 80 weight percent, usually from 5 to 25 weight percent, and can be from 10 to 20 weigh percent based on weight of total resin solids present in the curing agent (b). In such instances, the covalently bonded halogen content present in the curing agent (b) can be derived from for example, a halogen containing blocked isocyanate can be prepared by at least partially blocking 4-chloro-6-methyl-1,3-phenylene diisocyanate with a suitable blocking agent such as 2-butoxy ethanol, If partially blocked, any residual isocyanate groups can be reacted with a polyol such as trimethol propane thereby increasing the molecular weight of the curing agent.

In a further embodiment of the present invention, the covalently bonded halogen content present in the resinous phase of the electrodepositable coating composition can be derived from a component (c) which is different from and present in addition to the resin (a) and the curing agent (b). In such instances, the component (c) typically is a covalently bonded halogen-containing compound selected from the group consisting of halogenated polyolefin, halogenated phosphate ester, halogenated phenol such as any of the halogenated phenols described above.

As aforementioned, the covalently bonded halogen content present in the resinous phase of the electrodepositable coating composition can be derived from the resin (a), the curing agent (b), the component (c), or any combination of the foregoing, provided that the covalently bonded halogen content is sufficient to ensure that the resultant electrodeposition coating when electrophoretically applied and cured passes flame resistance testing in accordance with IPC-TM-650 as previously discussed. The covalently bonded halogen content of the resinous phase of the electrodepositable coating composition also should be present in an amount insufficient to adversely affect the electrodeposition process and/or the resulting dielectric coating properties.

In one embodiment of the present invention, the electrodepositable coating compostion can further comprise a rheology modifier which can assist in the deposition of a smooth and uniform thickness of the dielectric coating on the surface of the hole or via walls as well as the edges at the via openings. Any of a variety of the rheology modifiers well-known in the coatings art can be employed for this purpose.

One suitable rheology modifier comprises a cationic microgel dispersion prepared by dispersing in aqueous medium a mixture of a cationic polyepoxide-amine reaction product which contains amine groups, typically primary amine groups, secondary amine groups and mixtures thereof, and a polyepoxide crosslinking agent, and heating the mixture to a temperature sufficient to crosslink the mixture, thus forming a cationic microgel dispersion. Such cationic microgel dispersions and their preparation are described in detail in U.S. Pat. No. 5,096,556 at column 1, line 66 to column 5, line 13, incorporated by reference herein. Other suitable rheology modifiers include the cationic microgel dispersion having a shell-core morphology described in detail in EP 0 272 500 B1. This microgel is prepared by emulsification in aqueous medium of a cationic film-forming resin and a thermosetting crosslinking agent, and heating the resultant emulsion to a temperature sufficient to crosslink the two components.

The cationic microgel is present in the electrodepositable coating composition in an amount sufficient to effect adequate rheology control and hole edge coverage, but insufficient to adversely affect flow of the electrodepositable composition upon application or surface roughness of the cured coating. For example, the cationic microgels described immediately above can be present in the resinous phase of the electrodepositable coating composition in an amount ranging from 0.1 to 30 weight percent, typically from 1 to 10 weight percent based on weight of total resin solids present in the resinous phase.

The electrodepositable coating composition is in the form of an aqueous dispersion. The term "dispersion" is believed to be a two-phase transparent, translucent or opaque resinous system in which the resin is in the dispersed phase and the water is in the continuous phase. The average particle size of the resinous phase is generally less than 1.0 micron, usually less than 0.5 micron, and typically less than 0.15 micron.

The concentration of the resinous phase in the aqueous medium is at least 1, and usually from 2 to 60 percent by weight based on total weight of the aqueous dispersion. When the compositions of the present invention are in the form of resin concentrates, they generally have a resin solids content of 20 to 60 percent by weight based on weight of the aqueous dispersion.

Electrodepositable coating compositions of the invention typically are supplied as two components: (1) a clear resin feed, which includes, generally, the active hydrogen-containing ionic electrodepositable resin, i.e., the main film-forming polymer, the curing agent, and any additional water-dispersible, non-pigmented components; and (2) a pigment paste, which, generally, includes one or more pigments, a water-dispersible grind resin which can be the same or different from the main-film forming polymer, and, optionally, additives such as catalysts, and wetting or dispersing aids. Electrodepositable coating components (1) and (2) are dispersed in an aqueous medium which comprises water and, usually, coalescing solvents to form an electrodeposition bath. Alternatively, the electrodepositable composition of the present invention can be supplied as a one-component composition. In a particular embodiment of the present invention, the electrodepositable coating composition can be supplied as a substantially pigment-free, one-component composition.

It should be appreciated that there are various methods by which the component (c), when employed, can be incorporated into the electrodepositable coating composition in the form of an electrodeposition bath. The component (c) can be incorporated "neat", that is, the component (c) or an aqueous solution thereof can be added directly to the dispersed electrodeposition composition components (1) and (2), or if applicable, to the dispersed one-component electrodeposition composition. Alternatively, the component (c) can be admixed with or dispersed in the clear resin feed (or any of the individual clear resin feed components, for example the film-forming resin or the curing agent) prior to dispersing components (1) and (2) in the aqueous medium. Further, the component (c) can be admixed with or dispersed in the pigment paste, or any of the individual pigment paste components, for example, the pigment grind resin prior to dispersing components (1) and (2) in the aqueous medium. Finally the component (c) can be added on-line directly to the electrodeposition bath.

The electrodepositable coating composition in the form of an electrodeposition bath typically has a resin solids content within the range of 5 to 25 percent by weight based on total weight of the electrodeposition bath.

As aforementioned, besides water, the aqueous medium may contain a coalescing solvent. Useful coalescing solvents include hydrocarbons, alcohols, esters, ethers and ketones. Usual coalescing solvents include alcohols, polyols and ketones. Specific coalescing solvents include isopropanol, butanol, 2-ethylhexanol, isophorone, 2-methoxypentanone, ethylene and propylene glycol and glycol ethers such as monoethyl, monobutyl and monohexyl ethers of ethylene glycol. The amount of coalescing solvent is generally between about 0.01 and 25 percent and when used, preferably from about 0.05 to about 5 percent by weight based on total weight of the aqueous medium.

Although typically substantially free of pigment, if desired, a pigment composition and/or various additives such as surfactants, wetting agents or catalyst can be included in the dispersion. The pigment composition may be of the conventional type comprising pigments, for example, iron oxides, strontium chromate, carbon black, titanium dioxide, talc, barium sulfate, as well as color-imparting pigments well known in the art. The electrodeposition bath can be, if desired, essentially free of chrome- and/or lead-containing pigments.

The pigment content of the dispersion is usually expressed as a pigment-to-resin ratio. In the practice of the invention, when pigment is employed, the pigment-to-resin ratio is usually within the range of about 0.02 to 1:1. The other additives mentioned above are usually in the dispersion in amounts ranging from 0.01 to 10 percent by weight based on weight of resin solids.

Illustrating the invention are the following examples which are not to be considered as limiting the invention to their details. Unless otherwise indicated, all parts and percentages in the following examples, as well as throughout the specification, are by weight.

EXAMPLES

The following describes the preparation of a circuitized substrate using the process of the present invention. Example A describes the preparation of a resinous binder comprised of a tetrabromobisphenol A which is used in the electrodepositable coating composition of Example 1. The electrodepositable coating composition of Example 1 in the form of an electrodeposition bath was used to provide a conformal dielectric coating on a perforate substrate, which was subsequently metallized, photoimaged, developed and stripped as described below.

Example A

This example describes the preparation of a cationic resinous binder used in the electrodepositable coating composition of the following Example 1. The resinous binder was prepared as described below from the following ingredients. All values listed represent parts by weight in grams.

| Ingredients | Example A |
| --- | --- |
| Crosslinker[1] | 1882 |
| Diethylene glycol monobutyl ether formal | 108.78 |
| EPON® 828[2] | 755.30 |
| Tetrabromobisphenol A | 694.90 |
| TETRONIC 150R1[3] | 0.33 |
| Diethanolamine | 51.55 |
| Aminopropyl diethanolamine | 113.2 |
| Distillate removed | (67.66) |
| Sulfamic acid | 45.17 |
| Deionized water | 2714 |
| Lactic acid[4] | 1.70 |
| Resin intermediate[5] | 244.7 |
| Gum rosin[5] | 27.49 |
| Deionized water | 2875 |

[1]Polyisocyanate curing agent prepared from the following ingredients:

| Ingredients | Parts by Weight (grams) |
| --- | --- |
| Ethanol | 92.0 |
| Propylene glycol | 456.0 |
| Polyol[a] | 739.5 |
| Methylisobutyl ketone | 476.5 |
| Diethylene glycol monobutyl ether formal[b] | 92.8 |
| DESMODUR LS2096[c] | 1320.0 |
| Methylisobutyl ketone | 76.50 |

[a]Bisphenol A/ethylene oxide adduct available from BASF Corporation as MACOL 98B.
[b]Available from BASF Corporation as MAZON 1651.
[c]Isocyanate available from Bayer Corporation.

The first five ingredients were charged to a suitably equipped reaction vessel under agitation. As the temperature reached about 25° C., the addition of DESMODUR LS2096 was begun. Temperature was increased to 105° C. at which time the last addition of methylisobutyl ketone was made. Temperature was held at 100° C. as the reaction was monitored for the disappearance of NCO by infrared spectroscopy at which time, the temperature was reduced to 80° C.

[2]Diglycidyl ether of bisphenol A available from Shell Oil and Chemical Company.
[3]Surfactant available from BASF Corporation.
[4]88% aqueous solution.
[5]Cationic resin prepared from the following ingredients.

| Ingredients | Parts by Weight (grams) |
| --- | --- |
| MAZEEN 355 70[a] | 603.34 |
| Acetic acid | 5.99 |
| Dibutyltindilaurate | 0.66 |
| Toluene diisocyanate | 87.17 |
| Sulfamic acid | 38.79 |
| Deionized water | 1289.89 |

[a]Aminediol available from BASF Corporation

The first two ingredients were charged to a suitably equipped reaction vessel and agitated for 10 minutes at which time dibutyltindilaurate was added. The toluene diisocyanate was added slowly as the reaction was permitted to exotherm to a temperature of 100° C. and held at that temperature until the disappearance of all NCO as monitored by infrared spectroscopy. The resin thus prepared was solubilized with the addition of sulfamic acid and deionized water under agitation. The final dispersion had a measured resin solids content of 26 percent by weight.

The crosslinker was added to a suitably equipped reaction vessel. The next four ingredients were added to the reaction vessel under mild agitation and the reaction mixture was heated to a temperature of 75° C. at which time the diethanolamine was added. The reaction mixture was held at that temperature for a period of 30 minutes. The aminopropyl diethanolamine was then added and the reaction mixture was permitted to exotherm to 132° C. and held at that temperature for a period of 2 hours. Distillate was removed. For solubilization, the reaction product was added under mild agitation to an admixture of the sulfamic acid, deionized water, lactic acid solution and cationic resin intermediate. The gum rosin solution was then added to the solubized resin, followed by deionized water in two sequential additions. Excess water and solvent were removed by stripping under vacuum at a temperature of 60°–65° C. The final reaction product had a measured resin solids content of approximately 40 percent by weight.

Example 1

The following example describes the preparation of an electrodepositable coating composition of the present invention in the form of an electrodeposition bath comprising the cationic resinous binder of Example A above. The electrodepositable coating composition was prepared as described below from the following ingredients. All values listed represent parts by weight in grams.

| Ingredients | Example 1 |
| --- | --- |
| Resinous binder of Example A | 704.9 |
| Hexyl cellosolve | 28.5 |
| E6278[1] | 13.2 |
| Deionized water | 3053.4 |

[1]Catalyst paste, available from PPG Industries, Inc.

The ingredients listed above were combined and mixed with mild agitation. The composition was ultrafiltered 50% and reconstituted with deionized water.

Preparation of a Circuitized Substrate:

A single layer of INVAR metal perforate (50 micron thickness) containing 200 micron diameter holes positioned 500 microns apart (center-to-center) in a square grid array (supplied by Buckbee-Mears, a division of BMC Industries, Inc.) was cleaned and micro-etched to remove undesirable dirt, oils and oxides. The pre-cleaned perforate substrate then was electroplated to provide a layer of copper metal having a thickness of 9 microns.

The electrodepositable coating composition of Example 1 above was electrophoretically applied to the electroplated substrate in an electrodeposition bath at a temperature of 105° F. (41° C.) at 90 Volts for 2 minutes. The electrocoated substrate was rinsed with deionized water and air dried such that all holes of the perforate substrate were free of water. The electrocoated substrate was heated to a temperature of 350° F. (177° C.) for 30 minutes to cure the electrodepositable coating, thereby providing a cured dielectric film thickness of 20 microns.

The electrocoated substrate was then metallized. The substrate was heated to a temperature of 50° C. for a period of 30 minutes to drive off any moisture that may have been absorbed during handling. The substrate thus dried was immediately introduced into a vacuum chamber for plasma treatment with argon ions to activate the coating surface. The substrate surface was then sputter coated with 200 angstroms of nickel followed by sputter coating with 3000 angstroms of copper. The metal layer thus formed was electroplated with an additional 9 microns of copper.

The metallized substrate was cleaned and micro-etched to remove any dirt, oils or oxides from the metal surface, then electrophoretically coated with ELECTROIMAGE® PLUS photoresist (available from PPG Industries, Inc.) at a temperature of 84° F. (29° C.) at 80 Volts for 90 seconds. The coated substrate then was rinsed with deionized water and heated to a temperature of 250° F. (120° C.) for 6 minutes to drive off any residual solvents and/or water. A photoresist coating having a dry film thickness of 5 microns was obtained. The coated substrate then was exposed to an ultraviolet light source through a phototool on each side, and developed with ELECTROIMAGE® Developer EID-523, photoresist developing solution (available from PPG Industries, Inc.) to expose copper in pre-selected areas. The exposed copper areas were etched with a cupric chloride acid etchant and the remaining photoresist stripped with ELECTROIMAGE® stripper EID-568 photoresist stripping solution (available from PPG Industries, Inc.), thereby providing a circuitized substrate.

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

Therefore we claim:

1. A process for forming metallized vias in a substrate comprising the following steps:
    (I) electrophoretically applying to an electroconductive substrate an electrodepositable coating composition onto all exposed surfaces of the substrate to form a conformal dielectric coating thereon,
    said electrodepositable coating composition comprising a resinous phase dispersed in an aqueous phase, said resinous phase comprising:
        (a) an ungelled, active hydrogen-containing, ionic group containing resin, and
        (b) a curing agent reactive with the active hydrogens of the resin (a),
        said resinous phase having a covalently bonded halogen content of at least 1 percent by weight based on total weight of resin solids present in said resinous phase,
    (II) ablating a surface of the conformal dielectric coating in a predetermined pattern to expose one or more section of the substrate;
    (III) applying a layer of metal to all surfaces to form metallized vias in the substrate.

2. The process of claim 1, wherein the vias extend to the substrate surface.

3. The process of claim 1, wherein the vias extend through the substrate.

4. The process of claim 1, wherein the substrate comprises a metal selected from perforate copper foil, an iron-nickel alloy and combinations thereof.

5. The process of claim 1, wherein the conformal dielectric coating is heated at a temperature and for a time sufficient to cure the dielectric coating prior to or subsequent to step (II).

6. The process of claim 5, wherein the cured dielectric coating passes flame resistance testing in accordance with IPC-TM-350 and has a dielectric constant of no more than 3.50.

7. The process of claim 6, wherein the cured dielectric coating has a dielectric constant of no more than 3.30.

8. The process of claim 6, wherein the cured dielectric coating has a dielectric constant of no more than 3.00.

9. The process of claim 6, where in the cured dielectric coating has a dielectric loss factor of no more than 0.01.

10. The process of claim 1, wherein the resinous phase of the electrodepositable coating composition has a covalently bonded halogen content ranging from 1 to 50 weight percent based on weight of total resin solids present in the resinous phase.

11. The process of claim 1, further comprising step (IV) applying a resinous photosensitive layer to the metal layer of step (III).

12. The process of claim 5, wherein the cured dielectric coating has a film thickness of no more than 25 microns.

13. A process for fabricating a circuit assembly comprising the following steps:
    (I) providing an electroconductive core
    (II) applying electrophoretically an electrodoepositable coating composition onto all exposed surfaces of the core to form a conformal dielectric coating thereon,
    said electrodepositable coating composition comprising a resinous phase dispersed in an aqueous phase, said resinous phase comprising:
        (a) an ungelled, active hydrogen-containing, ionic salt group-containing resin; and
        (b) a curing agent reactive with the active hydrogens of the resin (a),
        said resinous phase having a covalently bonded halogen content of at least 1 percent by weight based on total weight of resin solids present in said resinous phase;
    (III) ablating a surface of the conformal dielectric coating in a predetermined pattern to expose a section of the core;
    (IV) applying a layer of metal to all surfaces to form metallized vias in the core; and
    (V) applying a resinous photosensitive layer to the metal layer.

14. The process of claim 13, wherein the core is a metal core selected from perforate copper foil, an iron-nickel alloy, and combinations thereof.

15. The process of claim 14, wherein the metal core comprises a perforate copper foil.

16. The process of claim 14, wherein the metal core comprises an iron-nickel alloy.

17. The process of claim 13, wherein the resin (a) comprises a polymer derived from at least one of a polyepoxide polymer and an acrylic polymer.

18. The process of claim 17, wherein the resin (a) comprises cationic salt groups selected from amine salt groups and/or onium salt groups.

19. The process of claim 13, wherein the resin (a) has a covalently bonded halogen content ranging from 1 to 50 percent by weight based on total weight of resin solids present in the resin (a).

20. The process of claim 19, wherein the covalently bonded halogen content of the resin (a) is derived from a halogenated polyhydric phenol selected from at least one of chlorinated polyhydric phenol and brominated polyhydric phenol.

21. The process of claim 19, wherein the covalently bonded halogen content present in the resin (a) is derived from tetrabromobisphenol A.

22. The process of claim 13, wherein the curing agent (b) is selected from at least one of a blocked polyisocyanate and an aminoplast resin.

23. The process of claim 13, wherein the curing agent (b) has a covalently bonded halogen content ranging from 1 to 50 percent by weight based on total weight of resin solids present in the curing agent (b).

24. The process of claim 13, wherein the covalently bonded halogen content of the resinous phase of the electrodepositable coating composition is derived at least in part from a component (c) which is different from and present in addition to the resin (a) and the curing agent (b).

25. The process of claim 24, wherein component (c) comprises a covalently bonded halogen-containing compound selected from the group consisting of halogenated polyolefin, halogenated phosphate ester, halogenated phenol, and mixtures thereof.

26. The process of claim 13, wherein the electrodepositable coating composition further comprises a rheology modifier.

27. The process of claim 26, wherein the rheology modifier comprises a cationic microgel dispersion prepared by dispersing in aqueous medium a mixture of a cationic polyepoxide-amine reaction product which contains amine groups selected from the group consisting of primary amne groups, secondary amine groups and mixtures thereof and a polyepoxide crosslinking agent, and heating said mixture to a temperature sufficient to crosslink the mixture to form said cationic microgel dispersion.

28. The process of claim 13, wherein prior to step (III), said conformal coating is heated to a temperature and for a time sufficient to cure said coating.

29. The process of claim 28, wherein said cured conformal coating has a dielectric constant of less than or equal to 3.50.

30. The process of claim 28, wherein said cured conformal coating passes flame resistance testing in accordance with IPC-TM-650.

31. The process of claim 29, wherein said cured conformal coating has a dry film thickness of less than or equal to 25 microns.

32. A process for fabricating a circuit assembly comprising the following steps:
(I) providing an electroconductive core;
(II) providing a photoresist at predetermined locations on the surface of the core;
(III) applying electrophoretically an electrodepositable coating composition over the core of step (II), wherein said coating composition is deposited electrophoretically over all surfaces of the core except at the locations having the photoresist thereon,
said electrodepositable coating composition comprising a resinous phase dispersed in an aqueous phase, said resinous phase comprising:
(a) an ungelled, active hydrogen-containing, ionic salt group-containing resin; and
(b) a curing agent reactive with the active hydrogens of the resin (a),
said resinous phase having a covalently bonded halogen content of at least 1 percent by weight based on total weight of resin solids present in said resinous phase;
(IV) curing the electrophoretically applied coating composition to form a cured conformal dielectric layer over all surfaces of the core except at the locations having the photoresist thereon;
(V) removing said photoresist to form a circuit assembly having vias extending to said core at the locations previously covered with said resist; and
(VI) optionally, applying a layer of metal to all surfaces of the circuit assembly of step (V) to form metallized vias extending to said core.

33. The process of claim 32, wherein prior to providing the photoresist in step (II) at predetermined locations on the surface of the core, a layer of copper metal is applied to the core.

34. The process of claim 32, wherein the core comprises a metal core selected from perforate copper foil, iron-nickel alloy, and combinations thereof.

35. The process of claim 34, wherein the metal core comprises an iron-nickel alloy.

36. The process of claim 34, wherein the metal core comprises perforate copper foil.

37. The process of claim 32, wherein the resin (a) comprises a polymer derived from at least one of a polyepoxide polymer and an acrylic polymer.

38. The process of claim 37, wherein the resin (a) comprises cationic salt groups selected from amine salt groups and/or onium salt groups.

39. The process of claim 32, wherein the resin (a) has a covalently bonded halogen content ranging from 1 to 50 percent by weight based on total weight of resin solids present in the resin (a).

40. The process of claim 39, wherein the covalently bonded halogen content of the resin (a) is derived from a halogenated polyhydric phenol selected from at least one of chlorinated polyhydric phenol and brominated polyhydric phenol.

41. The process of claim 40, wherein the covalently bonded halogen content of the resin (a) is derived from tetrabromobisphenol A.

42. The process of claim 32, wherein the curing agent (b) comprises a compound selected from at least on of a blocked polyisocyanate and an aminoplast resin.

43. The process of claim 32, wherein the curing agent (b) has a covalently bonded halogen content ranging from 1 to 50 percent by weight based on total weight of resin solids present in the curing agent (b).

44. The process of claim 32, wherein the covalently bonded halogen content of the resinous phase is derived at least in part from a component (c) which is different from and present in addition to the resin (a) and the curing agent (b).

45. The process of claim 44, wherein component (c) comprises one or more covalently bonded halogen-containing compounds selected from the group consisting of halogenated polyolefin, halogenated phosphate ester, halogenated phenol, and mixtures thereof.

46. The process of claim 32, wherein said cured conformal dielectric coating has a dielectric constant of less than or equal to 3.50.

47. The process of claim 46, wherein said cured conformal dielectric coating has a dielectric constant of less than or equal to 3.30.

48. The process of claim 46, wherein said cured conformal coating has a film thickness of less than or equal to 25 microns.

* * * * *